United States Patent [19]

Kucharek

[11] Patent Number: 4,748,495

[45] Date of Patent: May 31, 1988

[54] HIGH DENSITY MULTI-CHIP INTERCONNECTION AND COOLING PACKAGE

[75] Inventor: Andrzej Kucharek, Mountain View, Calif.

[73] Assignee: Dypax Systems Corporation, Mountain View, Calif.

[21] Appl. No.: 763,957

[22] Filed: Aug. 8, 1985

[51] Int. Cl.⁴ .............................................. H02D 1/00
[52] U.S. Cl. ................................. 357/82; 174/16 HS; 361/382; 361/393
[58] Field of Search ............... 361/381, 382, 383, 392, 361/393, 408, 385, 386; 357/79, 81, 82; 174/52 FP, 16 HS

[56] References Cited

U.S. PATENT DOCUMENTS

| | | | |
|---|---|---|---|
| 3,864,607 | 2/1975 | Phillips | 361/383 |
| 4,153,107 | 5/1979 | Antonetti et al. | 165/185 |
| 4,203,129 | 5/1980 | Oktay et al. | 357/82 |
| 4,458,291 | 7/1984 | Yanagisawa et al. | 174/52 FP X |
| 4,546,376 | 10/1985 | Olsen et al. | 357/81 X |
| 4,603,345 | 7/1986 | Lee et al. | 357/81 |
| 4,620,215 | 10/1986 | Lee | 357/81 |

OTHER PUBLICATIONS

Mounting Technique for Solder Reflow Areal Array Mounted Silicon Chips which Allows Direct and Efficient Backside Heat Removal, IBM Tech. Disclosure, vol. 20, No. 12, May 1978.
New TCM Design Using Bellows, IBM Tech. Disclosure, vol. 28, No. 11, Apr. 1986.
Wilson, "Cooling Modern Main Frames-A Liquid Approach", *Computer Design*, 1983, pp. 219-225.
Markstein, "Surface-Mount Substrates: The Key in Going Leadless", *Electronic Packaging and Production*, 1983, pp. 50-55.
Blodgett et al., "Thermal Conduction Module: A High Performance Multi-Layer Ceramic Package", *IBM J. Res. Develop.* 26 1, 1982, pp. 30-35.

*Primary Examiner*—A. D. Pellinen
*Assistant Examiner*—Derek S. Jennings
*Attorney, Agent, or Firm*—Flehr, Hohbach, Test, Albritton & Herbert

[57] ABSTRACT

A package for mounting and cooling a high density array of integrated circuit chips includes an interconnection assembly for the IC chips which (1) provides base connections to a printed circuit board (PCB), which is adapted to connect to external signal circuits, and (2) separate peripheral power supply connections. The package also includes a cooling module containing fluid-cooled heat sinks that (a) collectively conform to the array of integrated circuit chips and (b) individually conform to the configuration and orientation of the individual chips. The heat sinks are conformed to the chip orientation independently of the coolant flow, which is established through the heat sinks immediately adjacent the interface. Among other aspects of the package, the interconnection assembly incorporates resilient connectors that provide essentially stress-impervious connections to the integrated circuit chips and to the signal PCB.

53 Claims, 8 Drawing Sheets

HIGH DENSITY MULTI-CHIP INTERCONNECTION AND COOLING PACKAGE

BACKGROUND OF THE INVENTION

The present invention relates to a power and signal connection system for a dense integrated circuit multi-chip package and to a fluid cooling system for the package.

In the design of high speed digital computers, the aim is to fit the largest number of silicon integrated circuit (IC) packages or chips into the least volume. The methods evolved for housing, interconnecting and cooling such chips have an important bearing on the performance and reliability of the computer.

Improvements in the design and fabrication of microelectronic devices have greatly increased the number of logic functions and data storage that can be put on a chip. There is also a tendency for the chips size to increase to the point where very large numbers of closely spaced terminals, in the range of 250–400, must be connected.

The combination of high interconnect density, high power and high computational speed requirements pose severe problems for chip packaging design technology. For example, the control of electrical parameters, such as impedance, which affect the characteristics of the transmission lines interconnecting the chips within the package, is of extreme importance if high speeds are to be attained. It is also important to maintain the correct working environment for the chips by providing a properly engineered heat transfer system. Furthermore, the chips should be free of mechanical stress during the process steps of fabricating the package and also during the subsequent operation of the package. These and other design considerations and problems are discussed more fully below as a preface to the description of the related solutions which are provided by the high density multi-chip package of the present invention.

In general, the characteristics of the transmission lines which interconnect chips within a package are affected by the direct current resistance of the lines and by the other impedance of the lines. The impedance of a line is a function of inductance, capacitance and resistance. These in turn depend upon the geometry of the line and the electrical and magnetic properties of the line and of its environment. High impedance values cause signal attenuation. In addition, mismatches between the impedance and the load resistance cause signal reflections. Discontinuities in the transmission lines associated with the routing of the line are a primary cause of this impedance mismatch. Such discontinuities also contribute to propagation delays and to unequal propagation times along different transmission line paths.

In terms of the minimum feature size and device density, the scale of integration of semiconductor devices on integrated circuit chips has improved greatly since the middle and late 1970's. Device densities have progressed from large scale integration (LSI) to very large scale integration (VLSI) and toward ultra-large scale integration (ULSI). As device densities have increased and as high density multi-chip packaging has been developed, both logic capabilities and data storage capacities have increased. In addition, the increased densities have decreased the transmission line path lengths somewhat. This has decreased the transmission times, for both device-to-device and chip-to-chip communications. Nonetheless, device switching speeds have also decreased, to the single nanosecond level. As a consequence, transmission times have become the primary component in propagation delays. That is, the path length of signal lines is the primary factor limiting the speed of operation of high speed computers. Thus, one crucial industry need is to further decrease the transmission line path lengths and, at the same time, to increase the uniformity of the electrical and magnetic characteristics of such lines in order to provide uniform, controlled signal transmission characteristics.

In addition to the sensitivity to uniform transmission characteristics and to the need for increasingly short transmission times, the increased size and density of VLSI and ULSI chips and the high density packaging require an increased number and density of contacts. Increasing the number of densely spaced contacts causes routing problems, and, ultimately, problems in achieving uniform, controlled signal transmission line characteristics. In addition, the increased on-chip device densities and increased chip-to-chip densities are accompanied by a large increase in power consumption per unit area and by problems in removing the resulting heat from the package.

Convective air cooling is thought to have been the prevalent prior art heat removal technique. However, as applied to high density logic, multi-chip, main frame computers, the high time volume of air required for convection air cooling necessitates blowers and large ducts. Such structural features use space that could otherwise be allocated to integrated circuits, and generate high noise levels.

An alternative approach, which increases the effectiveness of convection air cooling, is intermediate air cooling. In this technique, the heat is dissipated from the multi-chip micro-package by convection cooling using air that is pre-cooled by an external heat exchanger. The basic problem with this technique, however, is condensation by the chilled air, which can cause corrosion and which requires stringent air quality control.

An alternative to air cooling and pre-chilled or intermediate air cooling is to liquid cool the chip micropackages. One such technique, termed silent liquid integral cooling (SLIC) is disclosed in Wilson, "Cooling Modern Main Frames-A Liquid Approach" *Computer Design*, May, 1983, pp 219–225. Basically, the cooled liquid is applied "directly" to the back of the micro-package via a conformal intermediate copper sheet.

Another liquid cooling approach for multi-chip micro-packages involves the use of spring-loaded aluminum piston heat sinks mounted in an array corresponding to the chips. This technique is described, for example, in Blodgett et al, "Thermal Conduction Module: A High-Performance Multi-Layer Ceramic Package", *IBM J. Res. 1 Develop.* 26, 1, January, 1982, pp 30–35. See also Blodgett, "Microelectronic Packaging", Scientific American, pp 86–96. Referring to FIG. 1, using this approach an integrated circuit 10 is connected by solder ball-bonded contacts 11 to a multi-layer ceramic substrate 12 that contains all the chip interconnections and the pins 13 for connecting the chip signal and voltage contacts to an associated mother board. The spring-loaded pistons 14 are mounted within hat 16, which is cooled by a water-cooled cold plate 17. The individual piston heat sinks 14 contact associated individual chips via the rounded, ball-type bottom surface 18 of the heat sink. This ensures controlled-pressure contact between the heat sink and the associated integrated circuit chip. This structure provides essentially point contact whereas large area contact is necessary for uniform high thermal flux density, that is, for effective heat transfer. In addition, the cold plate 17 and the coolant flow therein are spaced some considerable distance from the heat transfer interface, which increases the resistance of the internal heat flow path.

Still another approach for cooling a leadless chip carrier is depicted in FIG. 2. In this system, leadless chip carriers 20 are mounted between a pair of heat sink pillars 21 and 22. The chip carriers 20 are interconnected by solder pillars 23 which bond the peripheral chip contacts to printed wiring board interconnect circuits 24. The chip is supported at the bottom by the heat sink pillar 21 and at the top by a spring heat sink 26 which is mounted within the upper heat sink pillar 22. The pillars are held together by screw 27. This arrangement apparently provides good conformal heat sink contact at both surfaces of the chip carrier. However, its heat dissipation efficiency is diminished since the heat transer surface is not contacted by the full surface area of the chip and the cold plate geometry has limited heat transfer efficiency with the cooling fluid. Further, intimate contact between the chip and the cold plate surface depends upon the ability of the printed wiring board to deform to accommodate dimensional tolerance inaccuracies. This interacts adversely with the system of pressure springs.

Still another consideration in the design and cooling of multi-chip integrated circuit packages is the thermal coefficient of expansion (TCE) of the various materials used in the assembly. Thermal-induced stress is an especially difficult problem for solder joints and other types of metallurgically-bonded joints, such as, for example, the joints between the chip contact pads of leadless chip carriers and the contact pads of substrate interconnect assemblies. TCE-induced stresses can result from the use of different materials in the conductors which meet at the joint. TCE stress also results from the overall different thermal expansion characteristics of the chip carrier and the substrate. The TCE mismatch between the chip carrier and substrate is a potentially catastrophic problem, both during the oven cycling which is used for military specifications and, more significantly for commercial applications, during the usual power cycling. The problem of solder joint damage due to flexure and, in particular, the problem of TCE differences between chip carriers and substrates, are discussed, for example, in Markstein, "Surface-Mount Substrates-The Key in Going Leadless", *Electronic Packaging and Production*, June, 1983, pp 50–55.

Of the conventional approaches available for alleviating the TCE mismatch (expansion restraints, compliant layers and compliant leads), the compliant lead approach using leads formed of stress-compliant materials is presently thought to be the most effective. However, while some of the thermal stress relief techniques may be relatively effective in alleviating stress during heating, virtually all are ineffective in combating thermal-induced stress during cooling cycles.

Finally, but not exhaustively, another problem for closely spaced conductors is cross-talk, which is associated with mutual inductive and capacitive coupling. To alleviate cross-talk, multi-layer chip interconnect assemblies should be formable with the transmission lines encased in an insulator sandwiched between two voltage reference planes. This structure also contributes to uniform well-defined impedance in the transmission lines.

SUMMARY OF THE INVENTION

In view of the above discussion, it is one object of the present invention to provide a multi-chip interconnection assembly which provides a high area density of chips and a high chip contact density.

It is another object of the present invention to provide efficient, flexible-contact fluid cooling of a dense integrated circuit chip array using heat sinks that conform to the orientation and surface configuration of the individual chips or chip carriers.

It is another object of the present invention to provide flexible-contact fluid cooling in which the coolant flow is directly through the heat sinks to provide low thermal resistance and efficient heat transfer between the heat sinks and the associated integrated circuit chips or chip carriers, and in which the cooling efficiency is essentially independent of the chip orientation.

It is yet another object of the present invention to provide the above-mentioned high chip and contact densities and, in particular, to provide a high density contact matrix which, despite the contact density, provides uniform transmission line impedance characteristics and uniform transmission line path lengths and signal transmission times.

It is still another object of the present invention to provide a module intraconnection assembly, i.e., a chip interconnection assembly, which provides discrete power and signal inputs to the chips from a base array of signal terminals and a peripheral array of power terminals.

It is an associated object of the present invention to provide multiple power supply voltage levels.

It is also an object of the present invention to provide a module intraconnection assembly, i.e., an interconnection assembly for chips mounted in the module, in which flexible connections to the chip power and signal contacts minimize mechanical stress, including thermal-induced stress, both to the chip contacts and to the interface between the chip contacts and the assembly contacts.

It is a related object to provide a high density multi-chip interconnection and cooling package in which the module connections are essentially unaffected by stress, such as thermal-induced stress, during heating and cooling cycles.

In one aspect, the present invention comprises a structure for mounting one or more bodies such as integrated circuit chips; a flexible plate or membrane for mounting heat sink elements in an array which corresponds to the array of integrated circuit chips; and biasing means such as, for example, spring-loaded pistons, for individually biasing the flexible-mounted heat sinks and integrated circuit chips into conformal contact. The individual heat sinks have a fluid passageway formed therein, preferably closely adjacent to the associated integrated circuit chip, for flowing cooling fluid through the heat sink to transfer heat from the integrated circuit chip.

In a high density array of heat sink elements which corresponds, for example, to a closely spaced, m x n array of integrated circuit chips, the individual rows or columns of heat sink elements are arranged end-to-end to provide a group of generally parallel channels. That is, each channel is defined by an essentially contiguous row or column of end-to-end heat sink passageways.

In a presently preferred high density arrangement, the integrated circuit chips are mounted in a generally planar array and the flexible membrane mounts a multiplicity of the heat sink elements (a) collectively in a generally planar matrix which is substantially aligned with the integrated circuit chip array and (b) individually in an alterable orientation which permits the adaptation of the orientation of the heat sink to that of the integrated circuit chip.

The structure of the present invention is adaptable for mounting and cooling various types of integrated circuit chips, including chips having surface-mounted contacts, those having ball-bonded contacts, and those having tape automated bonded contacts.

In another aspect, and one which can be implemented separately or in combination with the conformal cooling arrangement, the present invention relates to a connector assembly for providing discrete power supply input voltages and signal voltages to integrated circuit chips. The connector assembly comprises (a) frame means for mounting an array of integrated circuit chips with the chip contacts facing inward (where applicable, the frame mounts the integrated circuit chips in an array which corresponds generally to the array of heat sink elements); (b) a connector subassembly comprising (1) a pair of major surfaces on its opposite sides, the first surface being adjacent to the array of chips contacts, the second surface being a base surface, and the two opposite major surfaces defining a peripheral surface therebetween; (2) first flexible connector means including an array of contacts in the form of terminal pins mounted at the peripheral surface for resiliently connecting the chip power contacts to external power supply voltages; and (3) second flexible connector means, including an array of contacts mounted at the base surface for connecting the chip signal contacts to external signal circuits. The structure is completed by an external connector assembly, for example, in the form of a printed circuit terminal board, which connects the base signal contacts to external circuit connections such as a mother board.

In still another aspect, the flexible connections to the integrated circuit chip contacts each constitute a flexible segment of a signal line path and a power supply line path, as follows. Each flexible contact comprises a base such as, for example, a ceramic substrate; a flexible conductor member mounted to the base and extending upward, toward and across the associated chip contact; and a resilient insulator body which is interposed between the flexible conductor member and the base for resiliently urging the member against the chip contact. In still another aspect, the conductor member extends downward through the base and in combination with a second resilient insulator body defines an electrically common flexible contact on the opposite, bottom side of the base for connecting the chip signal contact to, for example, the associated printed circuit terminal board. The flexible conductor member "extends" through the base by way of its connection to a separate plated-through hole or via, or by way of forming the conductor member and through-hole conductor as a unitary conductor.

Alternatively, the flexible conductor members on the opposite sides of the base can be separately connected to metallization patterns which are selectively formed on the opposite top and bottom sides of the base. In a presently preferred working embodiment of the present invention, the flexible conductor members are dedicated power supply or signal contacts. A selected group of the feed-through or via connections provides the above-mentioned connections to the printed circuit board signal terminals. The metallization on the top and bottom sides of the base serve different power supply voltage levels and are connected by flexible, top and bottom, peripheral foil connectors to the associated peripheral terminals. The bottom side metallization is connected by a second selected group of the feed-through or via connectors to the chip power supply contacts.

DETAILED DESCRIPTION OF THE INVENTION

The invention is presented below by an initial overview of the major components or assemblies, followed by a detailed description of each such assembly.

Overview

Figure 3:
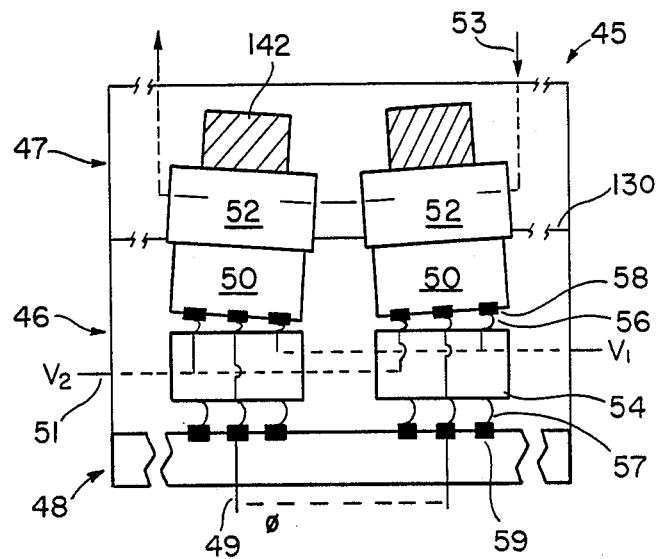
FIG. 3 is a highly simplified, schematic sectional view of a preferred embodiment of the high density, multi-chip interconnection and cooling package of the present invention.

FIG. 3 is a highly schematized, simplified section view that illustrates various functions of a presently preferred embodiment 45 of the high density multi-chip interconnection and cooling module of the present invention. Referring to FIG. 3 and to the partially cut-away perspective view of FIG. 4, the multi-chip module (MCM) 45 comprises an interconnect assembly 46 that mounts an array of integrated circuit chips 50 and provides internal, intra-module connections for the chips; a cooling module 47 for cooling the array of chips; and an external connector assembly 48 for the chip signal contacts/terminals. The intra-module connector assembly 46 (1) mounts one or several VLSI or ULSI chips 50 or a high density matrix of chips, (2) connects the chip signal contacts to the external connector assembly 48, which contains a base array of signal pins/terminals 49 for connections to external circuits, such as those contained in a motor board; and (3) also connects the chips to a discrete peripheral array of power supply pins/terminals 51. The cooling module 47 contained individual spring-biased conformal heat sink elements or modules 52 that adapt to the variations in orientation of the associated individual chips. The cooling module 47 also provides fluid coolant flow along a path, described generally by arrow 53, through the cooling modules 52. This arrangement provides non-turbulent, efficient cooling of the chip array. Please note, the variation in the chip-to-chip orientation is exaggerated in FIG. 4 to illustrate the conforming ability of the cooling modules 52.

The interconnect assembly 46 also contains an array of connector subassemblies 54, which are aligned with the array of IC chips 50. Each subassembly 54 contains an array of flexible upper contacts 56 that provide resilient contact to the contacts 58 on the corresponding IC chip. In addition, flexible lower contacts 57 provide resilient contact to the mating contacts 59 of the external connector assembly 48.

The advantages of this structure, described more fully below, include a very high chip contact density of, for example, 435 connections per square centimeter of chip surface area; multiple chip power supply voltage levels, as well as the above-mentioned discrete power and signal inputs; controlled-impedance transmission lines from the chip contact terminals; flexible contacts which eliminate stress on the chip terminals; and the flexible-contact cooling chamber, which affords very high cooling efficiencies.

Interconnect Assembly 46

Figure 5:
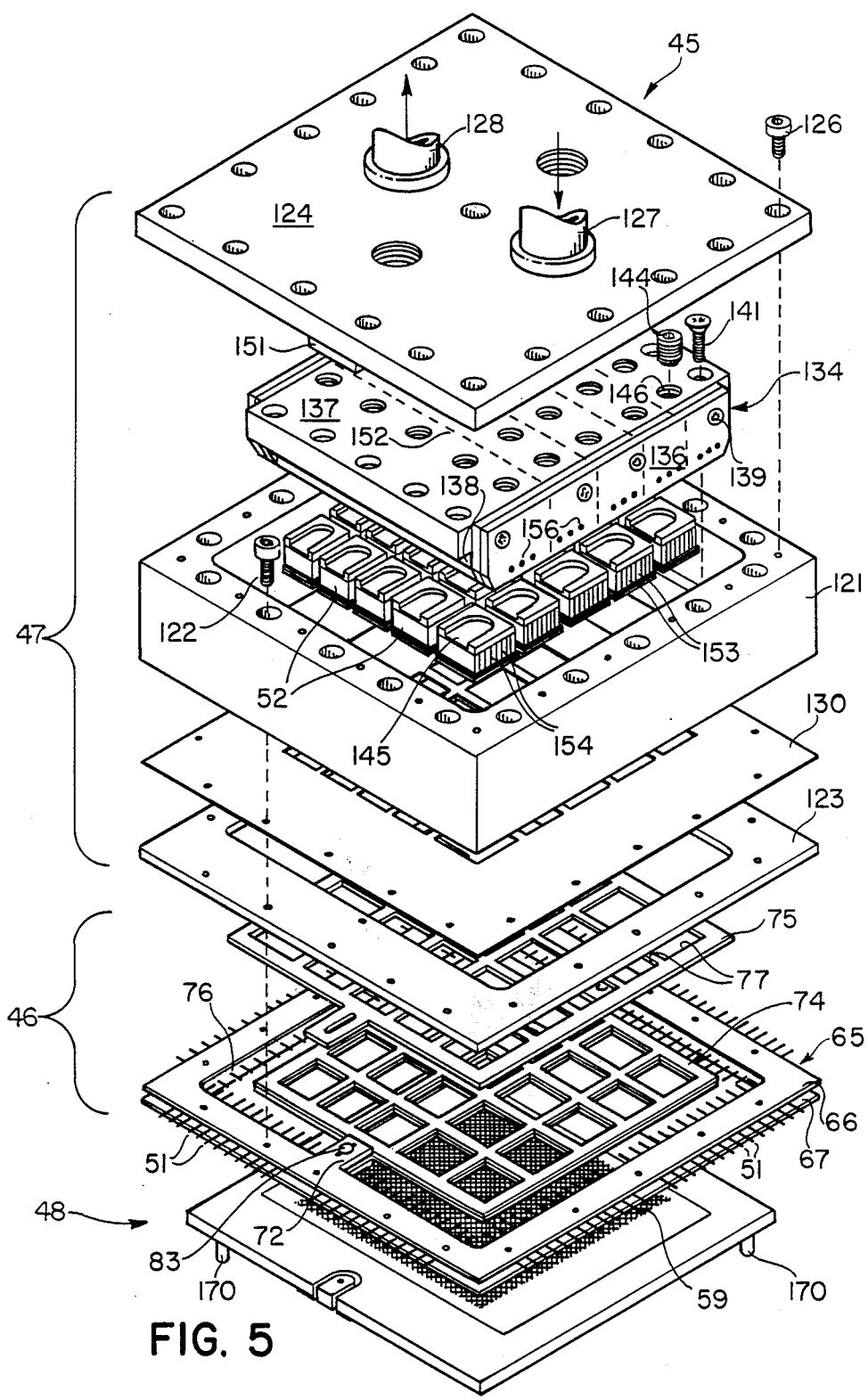
FIG. 5 is an exploded perspective view of the interconnection and cooling package shown in FIG. 1.
Figure 6:
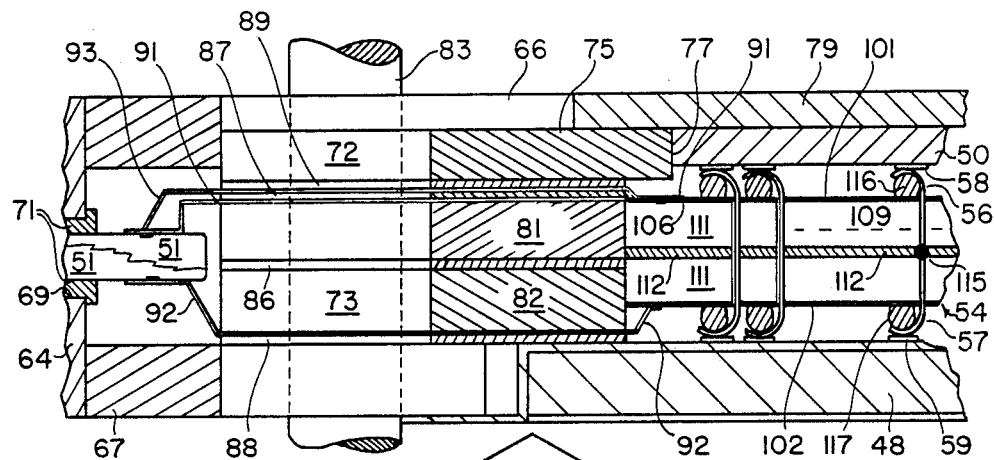
FIG. 6 is a partial, cross-section view of the interconnect assembly and the external connector assembly.
Figure 7:
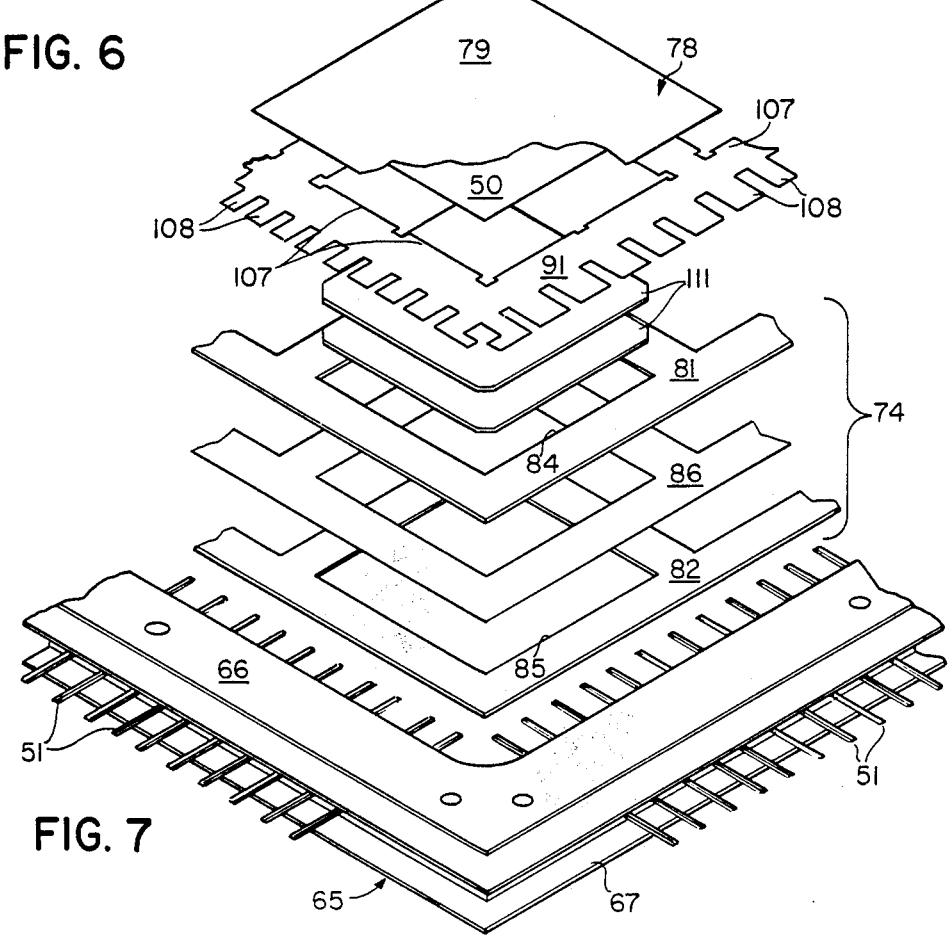
FIG. 7 is a partial, exploded view of the interconnect assembly.

The intra-module connection assembly 46 can best be understood referring to the exploded perspective view of the package 45 shown in FIG. 5, the partial, cross-sectional view of the assembled interconnect assembly 46 and external connector assembly 48 shown in FIG. 6 and the partial, exploded perspective view of the assembly 46 that is shown in FIG. 7. The assembly 46 includes a frame assembly 65 that comprises a power supply terminal plate 64 (FIG. 6) mounted between and formed integrally as part of (or metallurgically bonded to) generally rectangular, apertured upper and lower frame plates 66 and 67. The terminal plate 64 mounts a number of the power supply terminal pins 51 so that they extend through apertures 69 (FIG. 6), typically on all four sides of the plate, and are sealed to and electrically insulated from the plate by glass-to-metal seals 71—71 (FIG. 6).

As shown most clearly in FIGS. 5 and 6, the upper frame plate 66 includes a pair of inwardly extending flanges 72, each on opposite sides of the plate (only one flange 72 is shown), while the lower plate includes a corresponding pair of flanges 73—73. The two pairs of flanges cooperatively mount a power bus plate assembly 74 and a chip mounting plate 75 within the aperture 76 of the frame assembly 65. The chip mounting plate 75 includes one or more apertures 77 (FIG. 5) for receiving and mounting a corresponding number of chip assemblies 78 (FIG. 7). Each chip assembly 78 includes an integrated circuit chip 50 which is metallurgically bonded to a larger, metal heat spreader plate 79 that both supports the chip within the associated plate aperture 77, and also serves to distribute the heat which is generated at discrete points within the chip 50 to the cooling module 47. The optional heat spreader plate 79 preferably is formed of a material such as molybdenum that closely matches the thermal expansion coefficient of the chip 50 to control thermal-induced mechanical stress in the chip.

It should be noted that although the figures show a module 45 containing a square, five×five array of twenty-five chips 50, each having an exemplary dimension of about one centimeter on each side, the package is not limited to such an array and may in fact contain any number of IC chips. Nor is the chip size limited to one centimeter square. Rather, the particular number of chips and the exemplary size are chosen merely for purposes of illustration.

The power bus plate assembly 74 performs a crucial part in the previously mentioned function of providing separate external power and signal connections. Referring further, to FIGS. 5–8, particularly to FIG. 7, the bus plate assembly 74 comprises upper and lower conductive plates 81 and 82, which correspond generally to the shape of, but are thicker than, the chip mounting plate 75. The bus plate assembly 74 and the chip mounting plate 75 are mounted in precise alignment to the frame assembly 65 by alignment pins 83 in the frame assembly flanges 72 and 73. Each bus plate 81 and 82 forms a five×five array of one cm×one cm windows or apertures 84 and 85, respectively, that corresponds to the chip array. Each window 84,85 supports one of the flexible connector subassemblies 54 in alignment with a corresponding chip 50. The bus plates 81,82 are insulated from one another by insulation 86, which may be a discrete layer or plate of insulation, or may be formed as a layer on one of the plates 81,82. As discussed below, during operation of the chip array, the bus plates 81 and 82 are maintained at different voltage potentials $V_1$ and $V_2$, respectively, such as, for example, +5 volts and ground.

Figure 8:
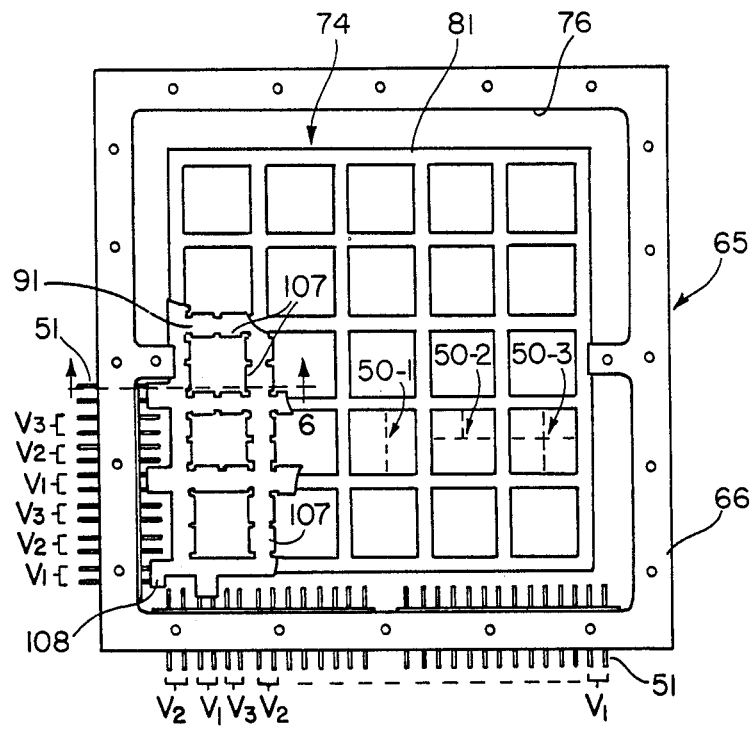
FIG. 8 is a top plan view of the interconnect assembly with the chip mounting plate and IC chips removed and with the flexible connectors partially cut away for clarity.

Referring further to FIGS. 6–8 and, in particular to FIG. 6, electrical power supply connections are made to the bus plates 81 and 82 and to the individual chip connector subassemblies 54 by so-called flexible conductors or connectors 91 and 92 (also called "flex circuits" here). These are flexible conductor sheets that are typically formed of metal foil and can be metallurgically bonded at one end to the respective bus plate 81 or 82 and at the opposite end to the group of power supply terminal pins 51 which connect to $V_1$ or $V_2$. Flexible connector 91 is soldered or otherwise metallurgically attached to the exposed upper surface of $V_1$ bus plate 81. The second flexible connector, 92, is similarly bonded to the exposed bottom surface of the $V_2$ bus plate 82. Layers 87 and 88 of insulation are formed on the upper and lower outside surfaces of the flexible connectors 91 and 92, respectively, to electrically isolate these flex circuits from surrounding structures. The insulation layers 87 and 88 (as well as the insulation 89 for the third flex circuit 93, described below) may be discrete layers or plates or may be deposited or otherwise formed on the associated metallic foil.

It should be noted that, in addition to connecting to the bus plates 81 and 82, the flexible connectors 91 and 92 also provide power connections to the individual chip connector subassemblies 54 for ultimate connection to the IC chips 50. The flexible nature of the connectors such as 91 and 92 permits relative movement between the power connections and (1) the terminal pins 51 at one end and (2) the bus plates 81 and 82 and (3) the connector subassemblies 54 at the other end without stressing the associated metallurgical joints between the connections and these components. Thus, the flexible connectors such as 91 and 92 accommodate any TCE mismatch with the associated supporting structures and provide stress-free contacts during both heating and cooling cycles.

Referring further to FIG. 6, the layered construction of the module interconnect assembly 46 permits the use of a third flexible circuit 93, which in the exemplary arrangement shown in FIG. 6 is mounted over the upper flexible connector 91. This third connector 93 is electrically isolated from underlying flexible connector 91 by the insulating layer 87 and from other surrounding structures by an overlying insulating layer 89. This third flexible circuit connects the IC chips 50 to a third power supply voltage, $V_3$. Using this same approach, a fourth flexible circuit 94 (not shown) can be positioned on the bottom of the flexible circuit 92 to provide a fourth power supply voltage level, $V_4$. These additional voltage level capabilities are very desirable, for example, in providing a program voltage level for electrically alterable memory circuits or wherever additional voltage levels can be used. The flexible metal foil conductors can be metallurgically bonded to the bus plates 81,82, whereas the insulator layers 86–89 are bonded to the other components using a pressure sensitive adhesive to form the basic interconnect subassembly. Quite obviously, more than four voltage supply levels can be connected to the IC chips by adding additional flexible circuit levels. The additional flexible connectors 93 and 94 provide the same stress-free contacts that are provided by the inner flex connectors 91 and 92.

As shown in FIG. 6, the arrangement of spaced bus plates 81 and 82 is specifically and uniquely designed for connection to metallization 101,102 on the opposite, top and bottom surfaces of the chip connector subassemblies 54 to establish those surfaces as two voltage reference planes, i.e., as $V_1$ and $V_2$. The connector subassemblies 54 can readily be formed as single or multiple insulator layers 111, or as multiple conductor layers 111 separated by insulator layer 112. As will be recalled from the last paragraph of the Background of the Invention, this structural combination of an insulator layer(s) sandwiched between voltage reference planes is a presently preferred structure for controlling transmission line operating characteristics in interconnect assemblies.

It should also be noted that for high power level requirements, the appropriate ones of the power terminals 51 and, preferably, an array of adjacent ones of the power terminals 51 can be replaced, for example, by flat metal bus bars (not shown) which are connected to one of the flexible circuits for supplying power to the module 45.

FLEXIBLE CHIP CONNECTOR SUBASSEMBLIES 54

As indicated in the simplified schematic of FIG. 3, the flexible connector subassemblies 54—54 route and connect the appropriate integrated circuit chip contacts or pads 58 (1) to the associated external signal contact pads 59 in the external connector array (printed circuit board) 48 and (2) to the separate array of power supply terminals 51 (via the flexible connectors 91-94). A connector subassembly 54 is provided in each bus plate aperture 77 corresponding to an associated integrated circuit chip 50. As discussed in detail below, each chip connector subassembly 54 can have one or more layers of metallization on each of its major surfaces (see in particular FIGS. 9 and 10) to provide the required number of voltages planes for the voltage levels $V_1$, $V_2$, etc. Each of these individual metallization layers may be connected as a single voltage reference plane or may be divided into different voltage levels.

Referring to FIG. 6 for an overview of the detailed description which follows, those chip contacts 58 that are associated with a particular power supply voltage, such as $V_1$, are coupled by the flexible connectors/terminals 56 of the connector subassembly 54 to a metallization pattern, such as 101, and from there to a flexible foil circuit, such as 91, which, as described previously, connects to the $V_1$ power supply terminals (FIG. 8). The chip signal contacts are coupled by the flexible connectors 56 and 57 of the subassembly 54 to the contacts 59 of the external signal connector assembly 48.

Figure 9:
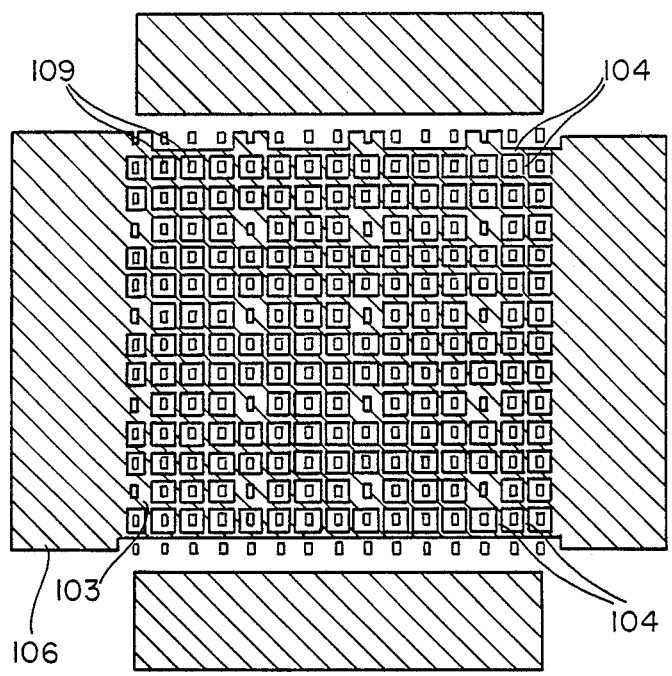
FIG. 9 illustrates the layout of an exemplary metallization pattern for connecting the flexible circuit connectors to the chip connector subassembly.
Figure 10:
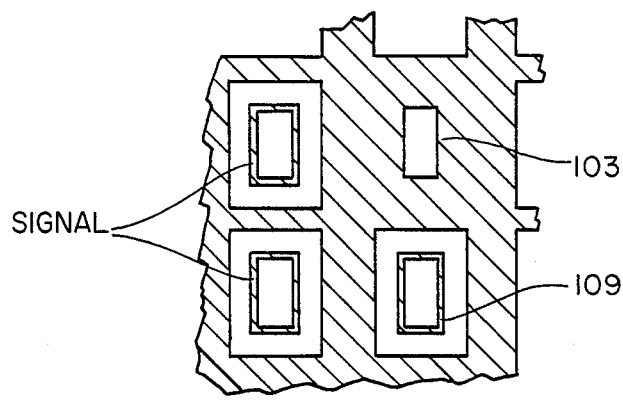
FIG. 10 is an enlarged view of a portion of the metallization of FIG. 9 illustrating the metallization pads and plated through-hole connections.

Considering now the two-level power supply case involving levels $V_1$ and $V_2$, the above-mentioned routing and interconnection of the power leads is provided by metallization patterns 101 and 102 shown in FIG. 6. The metallization is formed on the top and bottom outer surfaces of the chip connector subassembly 54. FIGS. 9 and 10 show one example of such a metallization pattern. The exemplary pattern typically can comprise a plated copper layer about 0.001–0.0015 inches thick formed on a plated tungsten underlayer approximately 0.0008 inches thick. This metallization comprises an array of terminals or pads 103 formed at locations corresponding to the chip terminals which are to be connected to the particular power level, such as $V_1$. The $V_1$ pads 103 are interconnected by an xy array of metallization conductor lines 104, which also connect the pads 103 to one or more of four external connection pads 106 located at the periphery of the chip connector subassembly. The flexible terminals 56 that are associated with the chip $V_1$ power contacts 58 are bonded to the chip connector subassembly 54 at the pads 103 to thereby connect the chip $V_1$ terminals to the metallization pattern 101. Referring also to FIGS. 7 and 8, the metallization pads 106 are bonded to the flex circuit 91 at tab contacts 107 that are formed in the flex circuit about the periphery of the chip connector subassembly 54. Connection is provided from the flex circuit 91 to the associated power supply terminal pins 51 by an array of tab contacts 108—108 formed peripherally about the outside of the flex circuit.

FIG. 8 also illustrates the versatility of this interconnection approach in connecting various power supply voltage levels to the rectangular peripheral array of power supply terminal pins 51. Please note, FIG. 8 represents only one of many interconnection arrangements. Typically, adjacent pairs of terminal pins 51 are assigned in a repetitive sequence to the power supply levels, here, $V_1$, $V_2$, $V_3$, $V_1$, $V_2$, $V_3$, etc. As shown by way of example in FIG. 8, every third one of the flexible circuit tabs 108 is bonded to a pair of the $V_1$ terminals 51—51, whereas the other peripheral tab locations are devoid of the tabs 108—108. In this way, the particular flex circuit 91 is connected to the single power supply voltage, $V_1$. In turn, internal tab contacts 107 are provided at the location of the connector 54 for each of the 25 chips that is connected to voltage level $V_1$. Any chip 50 which is not to be connected to voltage $V_1$ is isolated from that voltage by eliminating the conductor tabs 107 at the chip location.

By way of example, the chip location in the lower left hand corner of FIG. 8 corresponds to, i.e., is adapted for connection to, the metallization pattern 101 shown in FIG. 9. Thus, internal tab contacts 107 are provided on the left and right sides of this chip position for connection to the left and right side pads 106 in FIG. 9, which connect to the metallization 101. The upper and lower pads 106 are not connected to the metallization in the FIG. 9 pattern. These pads could be used to connect a different voltage level or levels to the metallization plane (if the metallization 101 were formed as discrete patterns). Alternatively, as many as four of the pads 106 (and the associated tabs 107) could be connected to the same $V_1$ metallization pattern 101. This symmetry provided by this connection to four pads is advantageous in some very high power computer circuit applications.

Where the voltage connection is provided to the bottom of the chip connector subassembly 54, as is the case for the $V_2$ voltage connection to metallization pattern 102, the associated metal pads 106 are connected by flexible connectors 57 to associated plated through-holes 109 (FIGS. 6 and 10), then to the flexible connectors 56, and by the connectors 56 to the associated chip $V_1$ power terminals 58.

Where a second flexible connector or circuit is provided on one side of the chip connector subassembly 54, such as the $V_3$ flex circuit 93 shown in FIG. 6, that flex circuit is isolated from the underlying flex circuit 91 by insulation such as 87. As mentioned, a separate dedicated group of power supply pins 51 such as those bracketed as $V_3$ in FIG. 8, is used to connect the chip to the external power supply voltage $V_3$. Within the chip connector subassembly 54, the same connection approach described above is used, except that selected ones of the conductor tabs 107 are used to supply voltage $V_1$, whereas others are used to supply voltage $V_3$. Thus, as shown in FIG. 8 for flex circuit 91, the chip location in the lower left-hand corner of the five-by-five array uses the left and right-hand side conductor tabs 107 to supply voltage $V_1$ to the chip, whereas the conductor tabs are deleted from the upper and lower tab locations. Conversely, for the overlying $V_3$ flex circuit 93 (which is not shown in FIG. 9) tabs 107—107 would be present in the upper and/or lower locations, but eliminated from the left and right side locations. Thus, the two isolated flexible circuits 91 and 93 connect the two voltage levels $V_1$ and $V_3$ to associated metallization patterns on the same chip 50. As mentioned previously, the two voltage levels can be supplied at the same metallization level or to two metallization levels.

Similarly, two additional voltage levels can be supplied at the bottom side of the chip connector subassembly 54 and applied via plated through-holes 109 to the same chip, thus connecting four power supply voltages to any individual integrated circuit chip. In addition, by adding additional flexible circuits and allocating/dividing the internal tabs 107 and pads 106, more than four power voltage levels can be connected to the chip(s).

Figure 11:
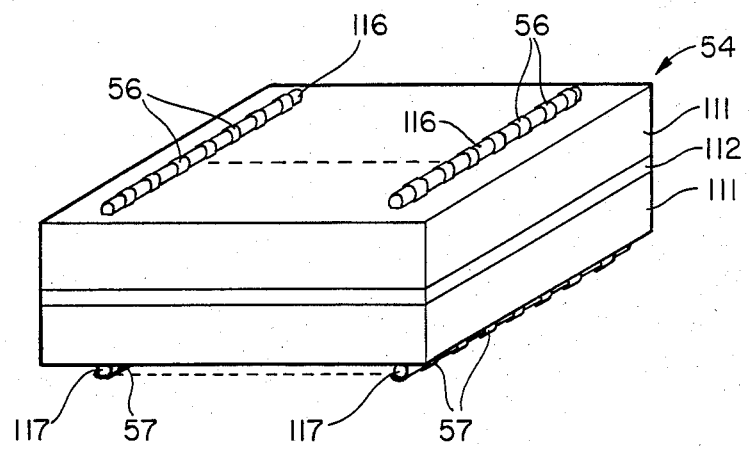
FIG. 11 is an enlarged perspective view of one embodiment of the chip connector subassembly shown in FIG. 6.

To turn from the circuit routing to the specific construction of one embodiment of the flexible chip connector subassembly 54, please refer to FIGS. 6 and 11. First, it should be mentioned that the illustrated subassembly 54 comprises a composite or sandwich formed by a pair of plates 111 which are formed of ceramic or other insulating material and are electrically insulated from one another by layer(s) of insulation 112 such as polyimide.

The interconnect subassembly 54 can comprise one or more substrates 111—111. The use of more than one substrate permits forming metallization voltage planes on the inner surface of the plates or substrates 111, in addition to the metallization voltage planes formed on the upper and lower, outer surfaces of the assembly 54. The particular embodiment shown in FIG. 6 comprises a pair of ceramic plates 111—111 that are separated by a structure 112 which can comprise insulation or one or more mutually insulated metallization layers. The metallization layers are connected to the appropriate feed-through connector or plated through-hole connector 109, such as, for example, by solder connections 115. It should be obvious at this point that only (1) the metallization layers on the bottom of the assembly 54 and (2) the signal connections, but not (3) the intermediate and upper metallization layers, require the use of feed-through connectors in the bottom plate 111. However, despite this, it is easier to manufacturer all plates 111 alike, that is, with plated through-hole connections at every hole position. The mating connectors in the upper and lower plates can then be joined, for example, by thermocompression bonding using patterned solder.

It is also true that the vertical feed-through and the substrates 111 can be replaced by the xyz multi-layer interconnect schemes mentioned in the Background of the Invention, which are then protected by the metallization voltage reference planes.

Each flexible connector subassembly 54 includes a number of the through-holes 109 which, typically, are plated throughholes. The through-holes correspond in number and location to the terminals 58 of the associated integrated circuit chip 50. In one exemplary embodiment, the through-hole plating comprises a metallization underlayer of tungsten which is about 0.008 inches thick and an overlayer of copper which is about 0.001 to 0.0015 inches thick.

Alternatively, instead of plating the through-holes, unitary conductor members or connectors such as wires or ribbons can replace the assembly of upper contact 56, through-hole plating 109 and lower contact 57.

Preferably, and as shown in FIG. 6, the terminals 56 and 57 are individual flexible metal conductor ribbons or connectors that are soldered or otherwise connected to the ends of the individual through-holes 109 at the top and bottom sides of the chip connector subassembly. The upper terminals 56 and the bottom terminals 57 are folded over and supported by respective flexible, insulating supports 116 and 117. These supports can be bonded to their associated connector plates 111 and 112. As shown in FIG. 11, the insulating springs 116 and 117 can be formed as cylinders into m columns of cylinders, each of which spans n row positions, corresponding to an associated m×n chip terminal array.

In a preferred embodiment, the flexible insulating supports 116 and 117 are formed of elastomeric material such as silicone rubber. The supports 116 and 117 are aligned to the chip contact terminals by means of the aligned, interlocking structure formed by the ceramic plates 111 of the connector subassembly, the frame assembly 65, the power bus plate assembly 74 and the apertured chip mounting plate 75 which locates the chip(s) 50. As mentioned, these structural components are aligned by the location pins 83—83.

The flexible terminals 56 and 57 can be bonded to the chip terminals 58 and the PCB terminals 59. Alternatively, the biasing action provided by the combination of the spring insulating supports 116 and 117 and the flexible terminals 56 and 57 can be used to provide flexible electrical contact to the chip terminals 58 and to the PCB signal terminals 59.

In addition, regardless of whether solder (metallurgically bonded) or solderless type connections are used, the flexible insulation-supported flexible terminals 56 and 57 accommodate movement and dimensional changes, both along and transverse to, the interface between the contacts 56,57 and the terminals 58,59. This arrangement provides comparatively stress-free contact between the connector subassembly and the chip and the PCB power terminals, despite relative movement between the chip connector assembly 54, the chip 50, the external connector assembly 48 and/or the power supply terminal pins 51, etc. This arrangement, thus, accommodates any TCE mismatch between components and/or assemblies and provides stress-free contact, e.g., during heating and cooling cycling.

It should be noted that the ceramic plates 111 of the interconnect subassembly 54 can be made of metal or can be a single layer or a multi-layered construction similar to a printed wiring board. The type of construction will be determined by the type of chip and the package design requirements. For example, the dual ceramic layers 111—111 can be replaced by a single ceramic layer 111 or by multiple layers of ceramic or by multiple conductor layers that are separated by insulating layers. The multiple layer construction is useful, for example, for selectively connecting a plurality or multiplicity of chips located within a single aperture 77. Examples of various plural and multiple chip configurations are illustrated schematically in FIG. 8 as alternative configurations 50-1, 50-2 and 50-3.

In summary, the intra-module interconnection assembly 46 and the chip connector subassembly 54 thereof provide stress-relieved electrical circuit paths through the flexible connectors 56, through-holes 109 and flexible connectors 57, which connect the chip signal terminals 58 to the PCB terminals 59 and, thus, to the pcb signal pins 49 for connection to external circuits. In addition, the above components of the chip connector subassembly 54 in conjunction with the flexible connectors such as 91 and 93, provide stress-relieved circuit paths between the chip power terminals 58 and the external power pins 51 associated with voltage levels such as $V_1$ and $V_2$.

External PCB Connector Assembly 48

The external assembly 48 is a conventional, commercially available multi-layer metal and ceramic printed circuit board. This pcb unit is aligned to the interconnect assembly 46 by pins 170. The pcb spans the entire array of chips 50 and provides a pattern of terminal pads 59 which forms a mirror image of the pads of the chip array. As mentioned, this printed circuit board 48 provides connections between the signal circuit paths in the connector subassembly 54 and external circuits. Thus, the signal lines pass through the interconnection assembly 46 to the corresponding contacts 59 of the printed circuit board 48 and then via the base array of pins 49 to the external signal circuits.

Cooling Module 47

Figure 2:
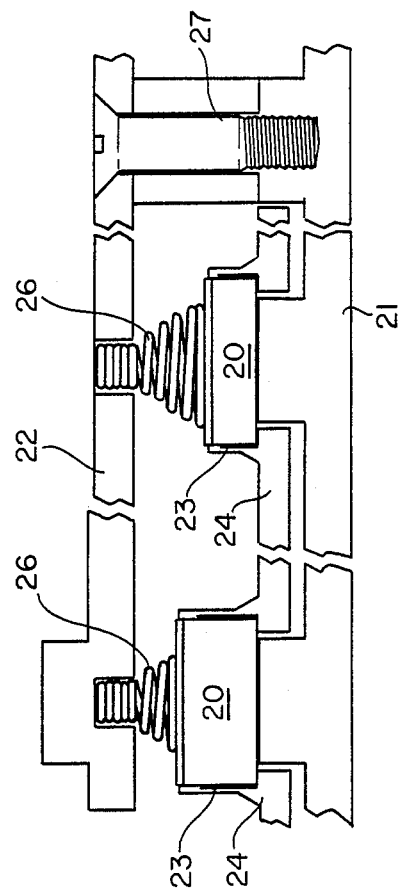
FIGS. 1 and 2 are simplified cross-sectional views of conventional structures that are used to cool leadless integrated circuit chip carriers.
Figure 1:
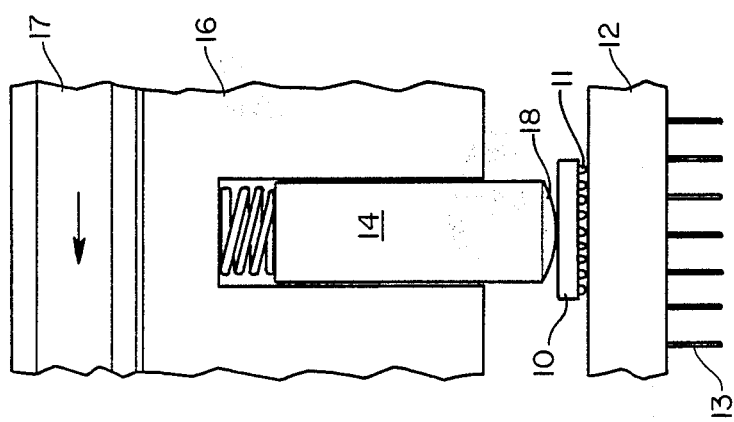

As mentioned previously, physically a chip array can be assembled so that the cooled surface of each chip lies in the same plane as the corresponding surfaces of other chips. However, even if a perfectly flat cooling surface were available for contacting all such chips, the lack of planarity in the chip array would prevent adequate, uniform thermal contact between the individual chips and the flat cooling surface. Thus, despite the use of this hypothetically flat cooling surface, substantial intra-chip and inter-chip temperature gradients would occur. Furthermore, while attempts have been made to remedy the situation, such as the prior art cooling approaches depicted in FIG. 1 and FIG. 2, the prior art structures are characterized by inadequate point contact (FIG. 1) and/or by the inability to adapt to the different orientations of the individual chips (FIG. 2). The cooling module 47 used in the present invention is designed to overcome these problems by providing large area thermal contact and by automatically conforming the contact interface between the cooling surface and the individual IC chips of the array to the orientations of the individual chips.

Figure 4:
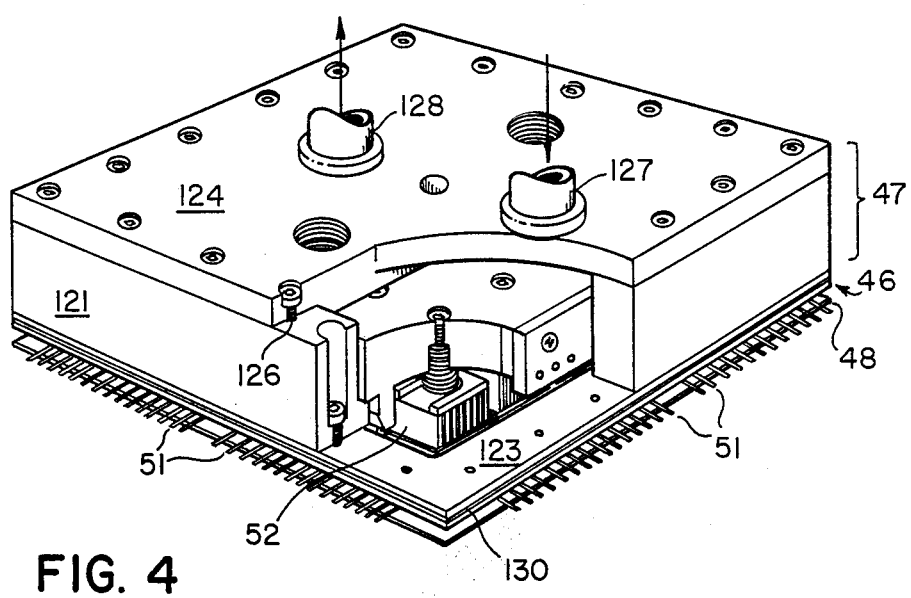
FIG. 4 is a partially cut-away perspective view of a preferred embodiment of the high density, multi-chip interconnection and cooling package of the present invention.

Referring now to the exemplary construction depicted in the drawings, the cooling module 47 shown in FIGS. 4 and 5 comprises a housing that includes a rectangular frame 121 which is attached by screws 122 to housing base plate 123, as well as to the module interconnection assembly 46. Alternatively, a single-piece construction can be used for frame 121 and base plate 123. Fluid-tight enclosure of the housing is completed by a cover plate 124 that is attached to the frame 121 by screws 126. The cover plate 124 has fluid I/O ports 127 and 128 that are coupled to an external source of fluid (not shown) such as air, freon, water, etc., for cooling the integrated circuit chips 50, which are mounted within the assembly 46.

Figure 4A:
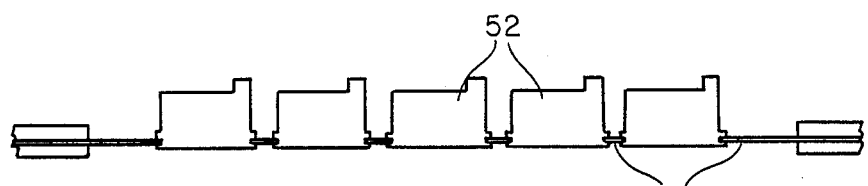
FIG. 4A is a sectional view of FIG. 4.
Figure 12:
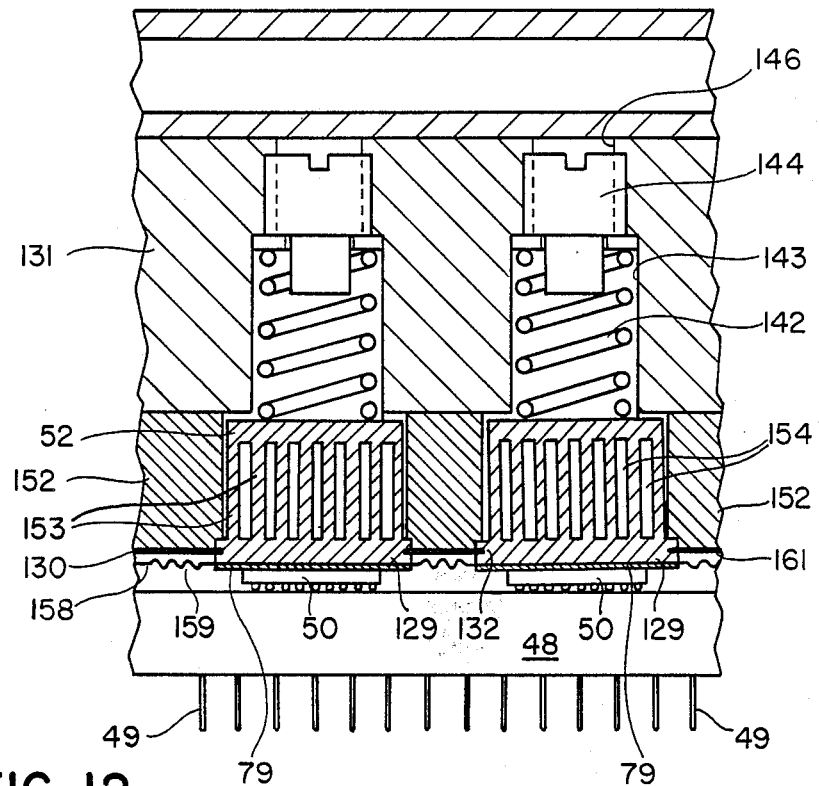
FIG. 12 is a partial, enlarged sectional view of the cooling module.

As shown in FIG. 5, the heat sink/cooling elements 52 are positioned within the housing for contacting and cooling the individual integrated circuit chips 50. As discussed previously with regard to FIG. 8, each chip 50 is attached/bonded to a heat spreader plate 79 that both supports the chip within the chip mounting plate apertures 77 (FIG. 5) and also serves as a heat sink. Each heat sink element 52 includes a flat, bottom plate 129 (FIG. 12) for contacting the underlying heat spreader plate 79. The heat sink elements/modules 52 are mounted in an m×n array, in alignment with the underlying heat spreader plates 79, by a flexible mounting plate or membrane 130. As shown in FIGS. 4A and 12, the base 129 of each heat sink element is formed with a peripheral groove 132. The flexible membrane 130 has an m×n matrix of apertures formed therein which receive the heat sink elements 52 and mate with the grooves 132 thereof so that the heat sink elements are mounted in an m×n array within the membrane.

Preferably, the membrane 130 is elastomeric material such as silicone rubber. The elastomer is bonded to the grooves 132 of the metal heat sink elements 52 so that the membrane 130 and heat sink elements define a continuous sealed surface. As shown in FIG. 4, the elastomeric membrane 130 is mounted between the housing base plate 123 and the frame plate 66 and, thus, seals the cooling chamber from the chip interconnect assembly 46. Alternatively, the membrane can also be bonded to grooves in the inside wall of housing 121.

In a present working embodiment, the spring insulator 116 is molded and bonded to the conductor 56 (57) and to the ceramic substrate 111 using vulcanization or thermocompression bonding. Similarly, the membrane 130 is molded and bonded to grooves formed in the sidewalls of the chamber 121 as to well as the grooves in the heat sink elements 52. The processes use a thermocompression mold configured to correspond to the shape of the elements. In a present working embodiment, the ribbon conductors 56 (and 57) are copper and the substrate 111 is ceramic. Both the membrane and the spring insulators are formed of Dow Corning silicon rubber GJ-70 using Dow Corning S-2260 primer, and a temperature of 375° F. and 25 ton pressure, applied for four minutes. The particular materials and parameters are given by way of example. For example, those of skill in the art will readily adapt the process to the use of aluminum ribbon conductors.

The sealed elastomeric mounting matrix provided by membrane 130 can deform mechanically to allow the heat sink element 52 to conform individually and independently to the non-horizontal orientation of the underlying chip assembly, which, otherwise, would prevent intimate contact between the element 52 and the chip heat spreader 79. That is, the elastomeric matrix 130 precisely aligns each heat sink element 52 over the associated underlying chip carrier assembly 78 and allows the flat heat sink base 129 to lie flat on the underlying heat spreader plate, although the plate and the chip carrier 78 are not positioned horizontally. See FIG. 12.

Figure 13:
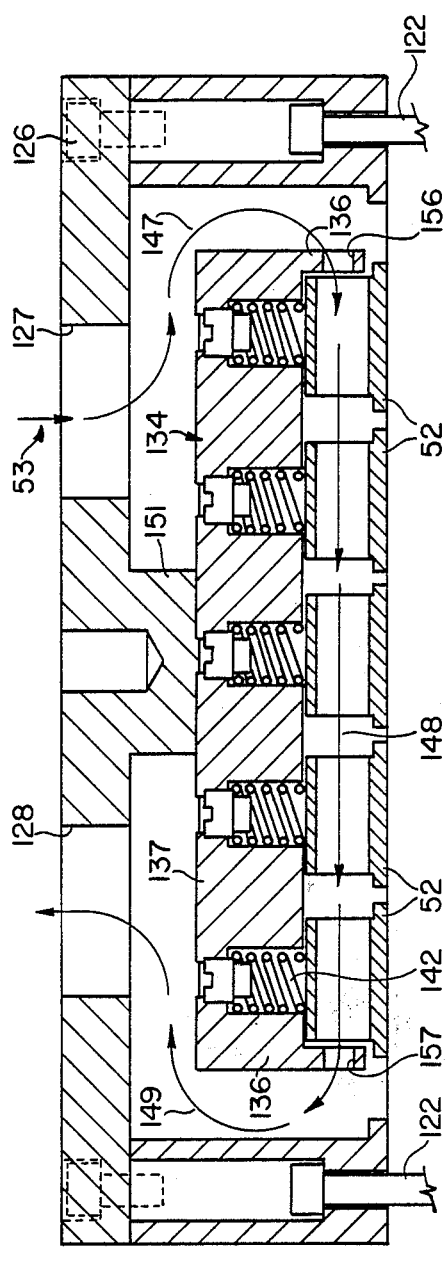
FIG. 13 is a sectional view of the cooling module perpendicular to the view of FIG. 12, illustrating the fluid flow path through the cooling module.

Referring to FIGS. 12 and 13, the cooling module 47 also includes the fluid distribution assembly 134. This assembly both controls the cooling flow of fluid within the module 47 and also provides controlled pressure contact between the fluid-cooled heat sink elements 52 and the chip heat spreader plates 79. Compression springs 142 are located within bores 143 in the top plate 137 for applying pressure to the associated finned heat sink elements 52 via locating slots 145 (FIG. 5). This biases the elements 52 against the chip heat spreader plates 79. A set screw 144 is mounted within a mating threaded section 146 of each bore for adjusting the pressure applied by the associated spring 142 to the underlying heat sink element 52 and the heat spreader plate 79. The temperature drop across the interface between the flat lower plate 129 of the heat sink element 52 and the spreader plate 69 is controlled by (1) the flatness of the mating surfaces of these elements, (2) by the ability of the elastomer matrix 130 to conform to the orientation of each heat sink element 52 to the underlying heat spreader plate 79, (3) by the screw-controlled adjustable contact pressure applied by the compression spring 142 and (4) by the direct fluid cooling of the heat sink elements 52 (described below). Since the interface between the heat sink base 129 and the heat spreader plate 79 is not metallurgically bonded, differences in thermal expansion coefficients of these two elements do not mechanically stress the interface. Thus, the selection of the material of the heat sink element is determined by thermal conductivity, rather than by relative thermal expansion coefficients. The finned heat plate elements can, thus, be made of good thermally conductive material, such as copper.

As mentioned previously and as indicated generally by arrow 53, FIG. 13, cooling fluid such as air is provided to the cooling module 47 under pressure via inlet port 127. The fluid then flows through the matrix of heat sink elements 52 and is exhausted from the chamber via exhaust port 128. The inlet and exhaust sections 147 and 149 of the coolant path 53 are separated by a rib 151 that is formed integrally with the housing cover plate 124 and abuts the top plate 137 of the fluid distribution assembly. In other words, rib 151 separates the housing into an inlet side and an exhaust side.

Consider, next, the typical m row × n column array of heat sink elements 52. The exemplary matrix shown in the drawings is a five × five row × column array. The ribs 152 shown in FIG. 12 and in phantom in FIG. 6 are located within the fluid distribution assembly and extend along and between each column of heat sink elements 52. Adjacent ribs provide separate coolant flow paths 148 through each column of five heat sink elements 52. See FIG. 13. Each heat sink element 52 is formed with alternative ribs 153 and passageways 154 (FIG. 12) which define the parallel fluid flow paths 148 (FIG. 13) through the heat sink element columns.

Referring further to FIG. 13, fluid flowing generally along fluid inlet path 147 enters each column of five contiguous heat sink elements by a group of apertures 156 formed in the wall 136 at the inlet end of the column, then flows generally along path 148 through the column of heat sink elements 52 and exits each column through a similar group of apertures 157 formed in the wall 136 at the exit end of the column, then is exhausted from the housing along path 149. Despite the structure required to provide the conformal, heat sink-to-spreader plate contact, the described fluid distribution assembly 134 and multiple-ribbed heat sink elements 52 cooperatively provide a high flow capacity, non-turbulent cooling flow path 53 through the finned heat sink elements 52. Efficient heat transfer is provided by flowing the coolant through the elements 52 directly adjacent (close to) the interface between the heat sinks and the spreader plates and by the multiple ribbed construction, which provides a large surface area for heat transfer.

It should be noted that in most, if not all, gas cooling operations, the elastomer plate 130 at the bottom of the cooling module 47 provides adequate sealing of the cooling module 47. In applications where cooling liquid such as water is used, a continuous, one-piece metal diaphragm 158, FIG. 14, can be mounted to the housing below the elastomeric matrix 130 to provide an additional barrier against coolant leakage. This diaphragm 158 can be attached at its outer edges to the housing of the cooling module 47. Preferably, the diaphragm contains corrugations 159 or other flexure means positioned between the heat sink elements 52 so that the diaphragm conforms with the heat sink elements 52 to the orientation of the individual integrated circuit chips.

In addition, the cooling module 47 can incorporate detection means (not shown), for example, for detecting the leakage of water vapor or other coolant into the interspace 161 between the elastomeric matrix 131 and the diaphragm 158; that is, for detecting leaks between from the cooling module 47 into the intra-module connection assembly, or vice versa.

Figure 14:
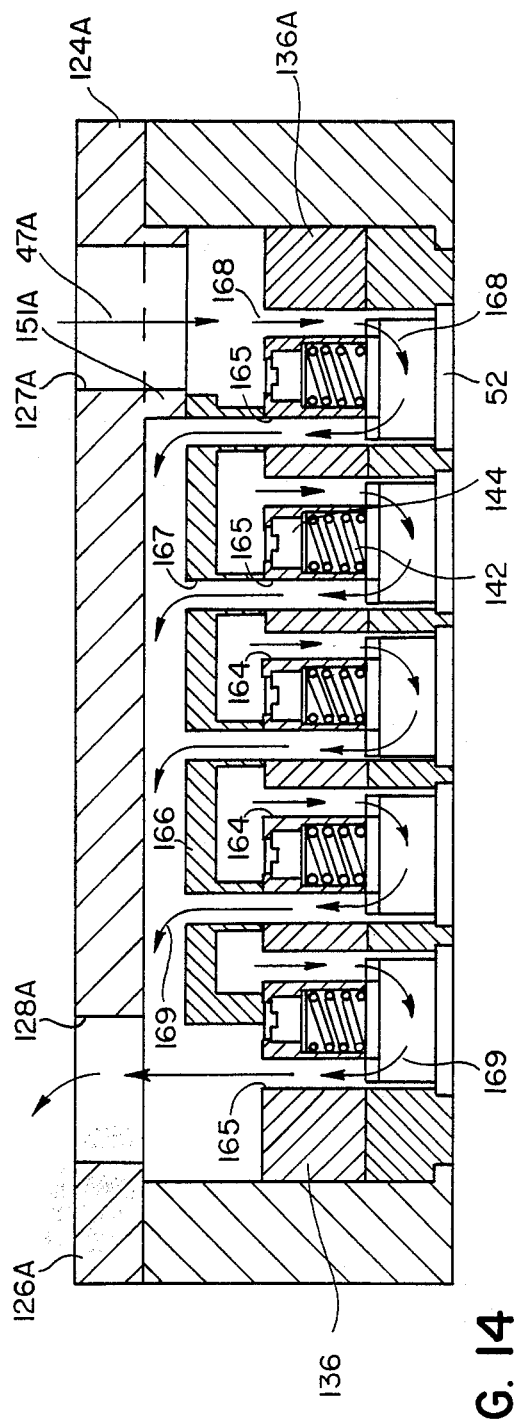
FIG. 14 is a sectional view of an alternative embodiment of the cooling module.

FIG. 14 depicts a cross-section of an alternative embodiment 47A of the cooling module 47. The cooling module 47A routes the coolant independently through each heat sink 52, rather than routing the coolant flow through a number of heat sinks which are arranged end-to-end, as is done in cooling module 47. Consequently, cooling module 47A should possess even greater cooling capability than the module 47. Coolant flows into and out of the module 47A through input port(s) 127A and output port(s) 128A. The coolant flows into each heat sink via a plurality of apertures 164 formed in the plate 136A and is exhausted from each heat sink via a plurality of apertures 165 in the plate. The cover 127A and plate 136A define a coolant flow chamber therebetween. Aperture plate 166 is mounted to the top of the wall plate 136A and, in conjunction with rib 151A in the cover, separates this chamber into inlet and exhaust flow paths. The plate 166 has a number of apertures 167 which connect to the exhaust apertures 165 for routing the coolant flow from the heat sinks into the chamber and out the port 128A. The coolant inlet flow which results from this structure is described generally by arrows designated 168 in FIG. 14, whereas the outlet flow paths are described by arrows designated 169.

SUMMARY

The various advantages of the high density multi-chip module package 45 of the present invention are described above. Several are repeated here, with respect to a package 45 which contains twenty-five chips each of one square centimeter, and in comparison to the tape automated bonding (TAB) technology and to the so-called flip chip design shown in FIG. 1. (The various features of, as well as the overall design of, the MCM package 45 apply to essentially any number of chips and to any size chip.)

Using twenty-five chips each of one square centimeter, each chip can have an interconnect density of approximately 435 I/Os and power contacts with very short impedance controlled lines. Chips are packed very close to each other to present a hermetic package, complete with integral cooling chamber 47, which measures less than 3.5 inch$^2$, as a board pluggable or surface mount unit. The module can comprise up to four or more chip voltage levels. The power supply is connected to the chip by a bus plate system which is independent from the chip wiring board 48 and mother board. The latter deals only with signal interconnects, which greatly simplify its structure and contributes to the high density contact design of the module. The present design can, thus, deal with high power levels without adding complication to the chip PWB design.

The cooling chamber 47 is a high efficiency device which, using present technology, can dissipate up to about 10 watts of heat per chip in an air cooled version and up to about 50 watts per chip in a water cooled version, and will readily accommodate the cooling needs of twenty-five or even a much greater number of chips.

The structure of the MCM package 45 also consists of the chip array with reverse sides in contact with the cooling chamber, and a thin compliant high density interconnect (designed around the chip interconnect subassemblies 54), which couples the chip signal I/Os to the ceramic PWB and distributes power at various voltage levels to the chip. The hermetic package terminates in a signal pin array (which may be either plugged in or surface mounted to a board), terminals for connecting with a power supply, and coolant connections.

These design features, coupled with the numerous structural features described at length previously, provide an interconnect assembly which in addition to being a high contact density design and to providing separate routing of power and signal interconnects, is essentially free of mechanical stress both during fabrication and operation of the package.

The above-mentioned TAB technology is gaining acceptance in chip packaging design, as replacement for wire bonding and more recently as a medium for attaining high lead count chip interconnects. The flip chip design shown in FIG. 1, which makes direct area contact with a substrate board using the solder ball method, has also been successfully developed. The flip chip approach perhaps offers a higher density of contacts than the TAB technology, since the chip is bumped over its entire surface. Using the TAB approach, contact is limited to locations at or near the chip periphery. However, a chip directly mounted to the PWB, that is, a flip chip, is limited in size by stresses induced in the bonding operation. Therefore, it is believed that the flip chip technology cannot accommodate the larger, more efficient chips that are coming into use. TAB is not limited in this way, but does have the inherent limitation of having contacts only near the edge of the chip. This limitation will become more severe as chip sizes continue to increase. Some efforts are being made to use TAB with some measure of area bonding, but the problem with this approach is that the tape design must accommodate a high degree fan-out of the leads if successful outer lead bonding is to be achieved. This detracts from the requirement to space chips as closely as possible in the package, giving longer leads which, of course, also have varying length and impedance.

In contrast, the multi-chip module 45 of the present invention does not suffer from the above limitation. Each chip can have a regular array of bumped terminals over its entire surface. The flexible interconnect approach allows stress-free bonded contact with the chips regardless of how large the chip is. Furthermore, lines in the interconnect assembly are all of the same length and have controlled impedance. Since there is no fan-out of lines, chips may be placed closely together in the package. The following table gives some comparison of the TAB technology and the present multi-chip module 45:

| ITEM | TAB | MCM 45 |
| --- | --- | --- |
| No. of Contacts with 1 cm$^2$ Chip | 300 | 435 |
| Gap Between Chips (inches) | 0.40 | 0.10 |
| Impedance Controlled Leads | No | Yes |
| Power Supplied Through P.W.B. | Yes | Optional |
| High Power Capability | Limited | Yes |
| Multiple Voltage Levels | No | Yes |

Having described preferred and alternative embodiments of my high density, multi-chip interconnection and cooling module, and various novel features thereof, it will be appreciated that those of skill in the art will readily develop other aspects of the invention which are within the scope of the claims.

What I claim is:

1. A structure for orienting first and second bodies, comprising: means for mounting at least one second body; a flexible membrane adapted for mounting at least one first body with a surface thereof facing a corresponding adjacent surface of the second body; and means for biasing the two bodies together such that the flexible membrane conforms the alignment of the surface of the first body to the adjacent surface of the second body and the bodies make contact along the facing surfaces.

2. The structure of claim 1, wherein the first body includes a passageway for flowing fluid therethrough to transfer heat between the two bodies.

3. The structure of claim 2, wherein the first body is a heat sink element; the passageway comprises a plurality of generally parallel channels adjacent the second body; and wherein the heat sink element also comprises means for directing fluid into and exhausting fluid from the passageway.

4. The structure of claim 2, wherein the first body is a heat sink element; the means for mounting the second body is adapted for mounting a multiplicity of such bodies in a generally planar array; and wherein the flexible membrane is adapted for mounting a multiplicity of the heat sink elements (a) collectively in a generally planar matrix which is substantially aligned with the array of second bodies and (b) individually in an alterable orientation for permitting adapting of the orientation of the facing surface thereof to that of a corresponding second body when the two bodies are biased together.

5. The structure of claim 4, wherein the matrix of heat sink elements comprises at least one channel formed by adjacent heat sink elements having their passageways aligned end-to-end for providing fluid flow from one end of the channel to the other.

6. The structure of claim 4, wherein the matrix of heat sink elements comprises at least one channel formed by adjacent heat sink elements having their passageways aligned end-to-end for providing fluid flow from one end of the channel to the other; and wherein the means for mounting the second bodies is adapted for mounting an m×n array of such bodies.

7. The structure of claim 6, wherein the flexible membrane mounts the heat sink elements as an m×n matrix corresponding to the array of second bodies.

8. An assembly for orienting first and second bodies such as heat sink elements and semiconductor bodies, comprising: means for mounting an array of one or more of the semiconductor bodies; a flexible membrane adapted for mounting at least one of the heat sink elements with a surface thereof facing a corresponding surface of the semiconductor body; and, means for biasing the two bodies together so that the flexible membrane allows the heat sink surface to conform to the semiconductor body surface and the two bodies make contact along the facing surfaces.

9. The assembly of claim 8, wherein the semiconductor body comprises an integrated circuit chip and a heat spreader plate bonded to the integrated circuit chip along one major surface of the plate so that the other major surface serves as said facing, heat transfer surface of the semiconductor body.

10. The assembly of claim 9, wherein the heat transfer surface of the heat sink element is copper.

11. The assembly of claim 9, wherein the heat spreader plate is molybdenum.

12. The assembly of claim 9, wherein the facing surfaces of the heat spreader plate and the heat sink element, are, respectively, molybdenum and copper.

13. The assembly of claim 9, wherein the integrated circuit chip includes surface mounted contacts.

14. The assembly of claim 9, wherein the integrated circuit chip includes ball bonded contacts.

15. The assembly of claim 9, wherein the integrated circuit chip includes tape automated bonded contacts.

16. The assembly of claim 8, wherein the heat sink element includes a passageway for flowing fluid therethrough to transfer heat between the two bodies.

17. The assembly of claim 16, wherein the heat sink passageway of the heat sink element comprises a plurality of generally parallel channels; and, wherein the assembly further comprises means for directing fluid into and exhausting fluid from the passageway.

18. The assembly of claim 16, wherein the means for mounting the semiconductor body is adapted for mounting a multiplicity of such bodies in a generally planar array; and wherein the flexible membrane is adapted for mounting a multiplicity of the heat sink elements (a) collectively in a generally planar matrix which is substantially aligned with the array of second bodies and (b) individually in an alterable orientation, for permitting adapting of the orientation of the facing surface thereof to that of a corresponding semiconductor body when the two bodies are biased together.

19. The assembly of claim 18, wherein the matrix of heat sink elements comprises at least one channel formed by adjacent heat sink elements having their passageways aligned end-to-end for providing fluid flow from one end of the channel to the other.

20. The assembly of claim 18, wherein the matrix of heat sink elements comprises at least one channel formed by adjacent heat sink elements having their passageways aligned end-to-end for providing fluid flow from one end of the channel to the other; and wherein the means for mounting these semiconductor bodies is adapted for mounting an m×n array of said bodies.

21. The assembly of claim 20, wherein the flexible membrane mounts the heat sink elements in an m×n matrix corresponding to the m×n array of semiconductor bodies.

22. The assembly of claim 9, wherein the heat sink element includes a passageway for flowing fluid therethrough to transfer heat between the two bodies.

23. The assembly of claim 22, wherein the heat sink passageway of the heat sink element comprises a plurality of generally parallel channels; and, wherein the assembly further comprises means for directing fluid into and exhausting fluid from the passageway.

24. The assembly of claim 22, wherein the means for mounting the semiconductor body is adapted for mounting a multiplicity of such bodies in a generally planar array; and wherein the flexible membrane is adapted for mounting a multiplicity of the heat sink elements (a) collectively in a generally planar matrix which is substantially aligned with the array of second bodies and (b) individually in an alterable orientation, for permitting adapting of the orientation of the facing surface thereof to that of a corresponding semiconductor body when the two bodies are biased together.

25. The assembly of claim 24, wherein the matrix of heat sink elements comprises at least one channel formed by adjacent heat sink elements having their passageways aligned end-to-end for providing fluid flow from one end of the channel to the other.

26. The assembly of claim 24, wherein the matrix of heat sink elements comprises at least one channel formed by adjacent heat sink elements having their passageways aligned end-to-end for providing fluid flow from one end of the channel to the other; and wherein the means for mounting the semiconductor bodies is adapted for mounting an m×n array of said bodies.

27. The assembly of claim 26, wherein the flexible membrane mounts the heat sink elements in an m×n matrix corresponding to the m×n array of semiconductor bodies.

28. The assembly of claim 27, wherein the facing surfaces of the heat spreader plate and the heat sink element, are, respectively, molybdenum and copper.

29. The assembly of claim 27, wherein the integrated circuit chip includes surface mounted contacts.

30. The assembly of claim 27, wherein the integrated circuit chip includes ball bonded contacts.

31. The assembly of claim 27, wherein the integrated circuit chip includes tape automated bonded contacts.

32. The assembly of claim 16 or 22, wherein each semiconductor body comprises a first group of contacts for providing power supply voltages to the semiconductor body and a second group of contacts for providing signal voltages to the semiconductor body and, wherein, the assembly further comprises an intra-assembly connector, which comprises: (a) the means for mounting the array of semiconductor bodies, said means being configured to correspond generally to the array of heat sink elements, said means having a pair of major surfaces on opposite sides thereof, the first surface being adjacent to the array of heat sink elements and the second surface being a base surface, and said means also having a periphery between the first and second opposite surfaces; (b) means, including an array of contacts in the form of terminal pins mounted at said periphery for connecting the chip power contacts or terminals to external power supply means; and (c) means, including an array of contacts mounted on said base surface, for connecting the chip signal contacts or terminals to external signal circuit means.

33. The assembly of claim 16 or 22, wherein each semiconductor body comprises contacts for providing power supply voltages to the semiconductor body and contacts for providing signal voltages to the semiconductor body and, wherein, the assembly further comprises:
an intra-assembly connector, which comprises: (a) the means for mounting the array of semiconductor bodies, said means being configured to correspond generally to the array of heat sink elements, said means having a pair of major surfaces on opposite sides, the first surface being adjacent to the array of heat sink elements and the second surface being a base surface, and said means also having a peripheral surface between the first and second opposite surfaces; (b) first connector means, including an array of contacts in the form of terminal pins mounted on said peripheral surface for connecting the chip power contacts or terminals to external power supply means; and (c) second connector means, including an array of contacts at said base surface, for connecting the chip signal contacts to said array of base contacts; and
a connector assembly comprising an insulating base having an array of terminals extending therefrom for connection to external signal circuit means and being adapted for mounting adjacent to said base surface of the intra-assembly connector for connecting said base array of signal contacts to the connector assembly terminals.

34. The assembly of claim 33, wherein the connnector assembly is a printed circuit board terminal assembly.

35. The assembly of claim 33, wherein the intra-assembly connector is adapted for interconnecting a plurality of semiconductor bodies and comprises: a multi-layer assembly formed in combination by the first and second connector means and comprising individual insulated layers of conductors, sandwiched between power supply voltage reference planes, and vias for selectively connecting the conductors to the semiconductor body contacts.

36. The interconnect assembly of claim 33, further including means for cooling the array of semiconductor bodies, comprising: an enclosed cooling chamber module mounted to the intra-assembly connector and having a flexible membrane therein adapted for mounting an array of heat sink elements immediately adjacent corresponding semiconductor bodies; each heat sink element comprising a heat sink body having a surface and a fluid cooling passageway immediately adjacent the surface; groups of the heat sink elements being mounted end-to-end by the flexible membrane to provide a continuous path therethrough, and the heat sink elements being mounted by the flexible membrane collectively in a generally planar array which is substantially aligned with the array of semiconductor bodies and individually in an alterable orientation permitting adaptation of the heat sink surface to a corresponding semiconductor body surface; spring means for biasing the individual heat sink elements against the semiconductor body surface, whereby the flexible membrane conforms the orientation of the heat sink surface to the orientation of the corresponding semiconductor body surface; and, fluid inlet and outlet means for directing cooling fluid through the groups of heat sink channels for cooling the semiconductor bodies.

37. An interconnect assembly for providing external power and signal connections to an array of integrated circuit chips arranged to provide a large number of, and a high density of, terminals, comprising:
a plate having apertures therein for mounting said chips in a substantially planar array;
a bus plate assembly comprising at least two substantially planar bus plates assembled in mutually insulated fashion along two major faces with the first and second outer major faces, and having apertures corresponding to the locations of the integrated circuit chips;
an external assembly comprising an insulated mounting plate and a plurality of terminals extending through the insulated mounting plate for providing electrical connection to external signal circuits;
a housing for mounting the bus plate between the chip mounting plate and the connector assembly with the bus plate apertures aligned with the chip mounting plate apertures and with the first major surface of the bus plate assembly facing the chip assembly and the second major surface of the bus plate assembly facing the connector assembly;
power supply pins mounted about the periphery of the housing for providing electrical connection to at least first and second power supply levels;
at least one chip connector subassembly, each said subassembly being sized and adapted for mounting within an aperture of the bus plate assembly, and comprising: planar insulator plate means supporting an array of flexible insulator springs on each major face thereof corresponding to the chip terminal pattern; a plurality of individual connectors, each providing a feed-through connection through the planar insulated plate to selectively connect chip power and signal terminals on said first side of the bus plate assembly to associated connector assembly terminals on said second major surface of the bus plate assembly and to associated power supply terminals, the individual feed-through connectors being supported at said first and second major surfaces by an associated insulator spring for decreasing the transmission of stress between the feedthrough connectors and the chip terminals and between the feedthrough connectors and the connector assembly terminals as the result of relative movement between the chip plate and the bus plate assembly and the connector assembly; and a metallization pattern formed on said first and second major surfaces of the planar insulator plate selectively connected to a first and a second plurality of the feed-through connectors on either major surface corresponding to the two power supply voltage levels; and at least a pair of patterned flexible conductor plates each overlying a separate one of said first and second bus plate surfaces and each being connected to one of said metallization patterns and associated power supply pins for selectively interconnecting the first and second power supply voltage levels to the associated first and second plurality of feed-through connectors.

38. The interconnect assembly of claim 37, further comprising means for cooling the integrated circuit chip array.

39. The interconnect assembly of claim 37, wherein the feed-through connectors each comprises a plated-through hole formed through the planar insulated plate means and a first and a second flexible conductor member connected to the opposite ends of the plated-through hole at said first and second major faces thereof.

40. The interconnect assembly of claim 37 or 39 wherein the chip array is an m×n array and wherein the array of flexible insulator springs comprises an m by n array comprising m cylinders of flexible insulator spring material, each spanning n row locations in the associated column.

41. The interconnect assembly of claim 37, wherein the planar insulator plate means of the chip connector subassembly comprises first and second plates assembled along two major faces thereof with first and second outer major faces thereof being said first and second major faces of the chip connector subassembly.

42. The interconnect assembly of claim 41, wherein the first and second plates are insulators.

43. The interconnect assembly of claim 41, wherein the first and second plates are conductive plates, and wherein the insulator plate means further comprises a layer of insulation formed between the first and second plates.

44. The interconnect assembly of claim 41, 42 or 43, wherein: the chip array location corresponding to at least one chip plate aperture comprises at least a plurality of separate integrated circuit chips and wherein the feed-through connectors for the chip array location are routed and interconnected internally within the planar insulator plate means for selectively interconnecting the terminals of the separate chips to the associated power or signal connection.

45. The interconnect assembly of claim 37, wherein: the power supply pins comprise a third group of pins for providing connection to a third external power supply voltage level; the chip interconnect assembly metallization includes a third layer of metallization overlying and insulated from one of the first and second layers of metallization, said third metallization layer being patterned to connect to a third group of feed-through connectors corresponding to the third power supply voltage level; and further comprising a third patterned flexible conductor plate formed over and insulated from an underlying one of the first and second patterned flexible conductor plates and selectively connecting the third group of power supply pins to the metallization for the associated third group of feed-through terminals.

46. The interconnect assembly of claim 37, wherein: the power supply pins comprise a third and fourth group of pins for providing connection to a third and fourth external power supply voltage level; the chip interconnect assembly metallization is patterned to interconnect a third and fourth group of feed-through connectors corresponding to the third and fourth power supply voltage level; and further comprising a third and fourth patterned flexible conductor plate formed over and insulated from an underlying one of the first and second patterned flexible conductor plates for selectively connecting the third and fourth groups of power supply pins to the metallization for the associated third and fourth group of feed-through terminals.

47. An interconnect assembly for connecting the terminals of an integrated circuit to external circuits, comprising:

a base having top and bottom surfaces and having conductive through-holes extending between the surfaces;

an array of terminals mounted on the top surface and to the through-holes and having a generally arcuate configuration extending upward from the base toward and across corresponding integrated circuit chip terminals;

an array of resilient insulator members mounted between the base and the associated arcuate terminals for biasing the terminals against the associated integrated circuit chip terminals; and an array of terminals on the bottom side of the base mounted electrically in common with associated through-holes for contacting the integrated circuit chip terminals to external circuits.

48. The interconnect assembly of claim 47, wherein the bottom terminal array comprises a second array of arcuate terminals mounted on the base to associated through-holes and resilient insulator members interposed between the base and the associated arcuate terminals.

49. The interconnect assembly of claim 47 or 48, wherein the array of insulator members comprises one or more unitary members extending across a number of terminal positions.

50. An interconnect assembly for separately connecting the power and signal terminals of an integrated circuit chip to external power and signal terminals comprising:

frame means adapted for supporting at least one integrated circuit chip and supporting a peripheral array of terminals and a separate base array of terminals, both being adapted for connection to external circuits;

an interconnect subassembly mounted between the chip position and the base and peripheral arrays of terminals and comprising: a base having conductive vias extending therethrough between first and second opposite sides; a first and second array of flexible terminals formed on the opposite sides and connected to associated vias for selectively interconnecting chip signal terminals to the base array of terminals; and flexible connector means adapted for interconnecting the peripheral array of terminals to selected ones of the flexible terminals to connect the chip power terminals to the peripheral terminals.

51. The interconnect assembly of claim 50, wherein the flexible circuit means comprises:

first and second layers of metallization formed on the associated first and second sides of the base and connected, respectively, to first and second groups of the chip power terminals; and first and second flexible foil connectors interconnecting, respectively, first and second groups of peripheral signal terminals to the respective first and second metallization layers for applying different power supply voltage levels associated with the first and second groups of peripheral terminals to the respective first and second groups of chip power supply terminals, and to supply the first and second power supply voltages to the first and second metallization layers to form voltage reference planes.

52. A module for cooling an array of at least one semiconductor body, comprising: an enclosed chamber module having a flexible membrane therein mounting an array of heat sink bodies; each heat sink body comprising a body having a surface and a fluid cooling passageway immediately adjacent the surface; groups of the heat sink bodies being mounted end-to-end by the flexible membrane to provide a continuous path therethrough, and the heat sink bodies being mounted by the flexible membrane collectively in a generally planar array and individually in an alterable orientation permitting adaptation of the heat sink surface to a corresponding underlying semiconductor body surface; spring means for biasing the individual heat sink bodies against the semiconductor body surface, whereby the flexible membrane conforms the orientation of the heat sink surface to the orientation of the corresponding semiconductor body surface; and, fluid inlet and outlet means for directing cooling fluid through the groups of heat sink bodies.

53. A module for cooling an array of at least one semiconductor body, comprising: an enclosed chamber module having a flexible membrane therein mounting an array of heat sink bodies; each heat sink body comprising a body having a surface and a fluid cooling passageway immediately adjacent the surface; means forming an inner chamber structure having inlet and outlet apertures for separately directing coolant fluid into and out of the individual heat sink bodies; the heat sink bodies being mounted by the flexible membrane collectively in a generally planar array and individually in an alterable orientation permitting adaptation of the heat sink surface to a corresponding underlying semiconductor body surface; spring means for biasing the individual heat sink bodies against the semiconductor body surface, whereby the flexible membrane conforms the orientation of the heat sink surface to the orientation of the corresponding semiconductor body surface; and, fluid inlet and outlet means for directing cooling fluid into and out of the inner chamber structure.

* * * * *